United States Patent [19]

Brunner et al.

[11] Patent Number: 5,049,200

[45] Date of Patent: Sep. 17, 1991

[54] PROCESS FOR THE HYDROPHILIZING AND/OR CEMENT-RESIDUE-REMOVING SURFACE TREATMENT OF SILICON WAFERS

[75] Inventors: Roland Brunner, Stubenberg; Susanne Bauer-Mayer, Burghausen; Rudolf Griesshammer, Altötting; Helmut Kirschner, Emmerting, all of Fed. Rep. of Germany

[73] Assignee: Wacker-Chemitronic Gesellschaft fur Elektronik-Grundstoffe mbH, Burghausen, Fed. Rep. of Germany

[21] Appl. No.: 253,988

[22] Filed: Oct. 5, 1988

[30] Foreign Application Priority Data

Nov. 13, 1987 [DE] Fed. Rep. of Germany ....... 3738651

[51] Int. Cl.$^5$ ............................................. B08B 3/04
[52] U.S. Cl. ......................................... 134/2; 134/15; 134/28; 134/29; 134/42
[58] Field of Search ................. 134/3, 2, 28, 15, 29, 134/40–42, 39; 252/95–106; 156/642, 643

[56] References Cited

U.S. PATENT DOCUMENTS

| | | | |
|---|---|---|---|
| 4,430,152 | 2/1984 | Okano | 134/2 |
| 4,545,918 | 10/1985 | Pralus | 134/3 |
| 4,695,327 | 9/1987 | Grebinski | 134/30 |
| 4,855,023 | 8/1989 | Clark et al. | 134/12 |
| 4,857,225 | 8/1989 | Terada et al. | 134/3 |

OTHER PUBLICATIONS

Modern Silicon Technology, pp. 202–203, Hans Herrmann et al. (1975).

*Primary Examiner*—Anthony McFarlane
*Attorney, Agent, or Firm*—Collard, Roe & Galgano

[57] ABSTRACT

Silicon wafers can be provided with a hydrophilic surface and/or freed of adhering cement residues originating from the polishing operation with the aid of solutions adjusted to a pH of 8 to 14 with the aid of alkali-metal or alkaline-earth-metal compounds and containing hydrogen peroxide. These processes can even be carried out at room temperature and are remarkable for their low chemical consumption and easy manageability.

9 Claims, No Drawings

PROCESS FOR THE HYDROPHILIZING AND/OR CEMENT-RESIDUE-REMOVING SURFACE TREATMENT OF SILICON WAFERS

BACKGROUND OF THE INVENTION

1. Field of the Invention

The invention relates to a process for the hydrophilizing and/or cement-residue-removing surface treatment of silicon slices or wafers by exposure to alkaline aqueous solutions containing hydrogen peroxide.

2. Description of the Prior Art

To produce electronic components from silicon, in most cases, silicon slices or wafers having at least one hydrophilic wafer surface are used. In this connection, the hydrophilic properties of the surfaces, which can be recognized qualitatively, for example, from the drainage behavior of a water drop applied to it, are usually produced as part of the treatment steps. These treatments are carried out subsequent to the polishing operation to remove adhering cement residues from the wafers and to finally clean the wafers before they are then packaged and passed on for despatch or storage.

A sequence of individual steps which basically goes back to a cleaning process (so-called "RCA cleaning") described by W. Kern and D. Puotinen in *RCA Review*, June 1970, pages 187 to 206 has gained wide acceptance for this treatment of polished wafers. In this case, adhering cement residues are removed with organic solvents, such as, for example, trichloroethylene, while the hydrophilizing step is carried out in a manner such that the silicon wafers are immersed in a bath containing an aqueous ammonia/hydrogen peroxide solution.

This procedure is, however, disadvantageous in a number of aspects. On the one hand, working with ammonia requires expensive exhaust plants just because of the nuisance caused by its smell. Furthermore, the bath has to be kept at elevated temperatures (usually 60°–85° C.) in order to achieve treatment times which are still economically acceptable. This results in an increased volatility of the ammonia so that, on the one hand, additional ammonia has to be supplied constantly and consequently the chemical requirements are correspondingly high. On the other hand, the ammonia concentration present in the bath is constantly subject to variations and this, in turn, has repercussions on the sensitive wafer surface. The phase in which the wafers are extracted from the bath and in the process are exposed to attack by the gaseous corrosive ammonia in the absence of the hydrogen peroxide which controls this reaction, has also proven to be particularly critical.

Another equally important disadvantage is the removal, usually before the hydrophilizing step, of the cement residues still adhering to the wafers after the polishing operation by means of organic, usually chlorine-containing solvents, such as trichloroethylene. In these solvents, it is particularly important to note the possible danger to health of the operating staff, the expensive preventative measures in terms of equipment necessitated thereby, such as exhausts and the like, and also the high costs of such solvents. In addition, in the case of all the solutions, it is difficult to remove interfering particles from the baths by filtration because of the high vapor pressure.

SUMMARY OF THE INVENTION

It is an object of the invention to provide a process for the surface treatment of silicon wafers which is economical to use and which, in particular, can be carried out at low temperatures with low chemical usage.

The foregoing and related objects are achieved by a process which comprises causing at least one aqueous solution having a minimum content of 0.1% by weight of hydrogen peroxide and adjusted to a pH of 8–14 with the aid of compounds of the alkali or alkaline-earth metals, to act on the wafer surface.

To adjust the pH of the aqueous solutions to 8–14, preferably 9–12, compounds of the alkali or alkaline-earth metals with an alkaline reaction can generally be used. The use of the latter is limited by the formation of sparingly soluble precipitates, such as, for example, carbonates, under the reaction conditions. In addition to the hydroxides, the salts formed with weak acids are primarily suitable, provided they do not react in an impermissible manner with hydrogen peroxide. The salts of alkali metals, especially of sodium and of potassium, with acids containing carbon, such as acetic acid or citric acid have proved successful. Simply for cost reasons, recourse will preferably be made to the use of carbonates, sodium and, in particular, potassium carbonate. It is especially beneficial in this connection, that such carbonate solutions have a buffer action in the pH range mentioned and are therefore particularly pH-stable. For this reason, other buffer systems can be used with particular advantage which are effective in these pH ranges, for example based on phosphate or borate.

The concentration of the alkali-metal or alkaline-earth-metal compounds in the solutions used according to the invention can be kept low. Often excellent results are achieved even in the concentration range from 0.1 to 10% by weight, preferably 0.3 to 5% by weight. In principle, however, it is possible to use more highly concentrated solutions right up to saturation. However, as low concentrations as possible, in general, will be used simply to reduce the risk of a contamination of the wafer surface by the cation present in a particular case or by heavy metal ions entrained with the compounds used in a particular case.

It has been found expedient to use compounds, such as, sodium or potassium carbonate, in as pure a form as possible, that is to say, to the greatest extent possible free of harmful heavy metal ions, such as, for example, iron, nickel, zinc, copper or lead. Suitable compounds in which the proportion of such interfering ions is in the range of ppm or ppb by weight are available commercially. To make up the solutions, high-purity water demineralized, for example, by single or multiple reverse osmosis, is suitable. The proportion of foreign ions in water purified in this manner is typically in the range of less than 10 ppb by weight.

The hydrogen peroxide added to the solution is also expediently used in as pure a form as possible, that is to say with the lowest possible proportion of foreign ions, in particular heavy metal ions. Suitable hydrogen peroxide solutions in which the proportion of impurities is only in the range of a few ppm by weight or below, are available commercially with a proportion of, for example, peroxide of 30% by weight or 5% by weight. In this connection, it is also advantageous if the proportion of hydrogen peroxide in the solution finally used can be kept low and is only at least 0.1% by weight, advantageously 0.3 to 5% by weight. In this manner, a further reduction in the proportion of impurities is achieved as a result of the dilution effect.

Expediently, the solutions are prepared in the composition chosen in a particular case and may then be used, optionally after one or more filtration steps, to reduce particulate impurities further in the hydrophilization and/or the removal or cement residues. It is possible, for example, to provide the solution in the form of an immersion bath in which the wafers to be treated are then immersed, mostly collected together in process trays. The required residence times are short even at room temperature; an adequate hydrophilization of or removal of cement from the wafer surface can generally be achieved even within 1 to 300 seconds. The residence times may possibly be reduced further by using temperature-controlled, for example thermostatically controlled baths. Generally, bath temperatures in the range from 15 to 40° C. have proved successful, but these temperatures may vary and are not to be understood as a restriction. The use of solutions held at higher temperatures up to their boiling range, is, however, not excluded and may be necessary, for example where a particularly rapid hydrophilization and/or removal of cement is desired. In principle, the lowest possible temperature variations should be observed in the interest of reproducible results, in particular, in the case of hydrophilization.

In the process according to the invention, the solution which effects the hydrophilization and/or cement removal can be caused to act on the wafer surface by other means than an immersion treatment. Equally suitable are also, for example, spray baths in which the hydrophilization agent selected in a particular case is sprayed on the surface to be treated by means of nozzles. In such spray baths a particularly rapid hydrophilization is usually possible, as is the combination of the hydrophilization and cement removal step to form a single process step.

Optionally, surfactants may also be added to the solutions used for the hydrophilization and/or cement removal in order to facilitate the stripping of particles from the wafer surface or to prevent their deposition on the wafer surfaces. Suitable surfactants are, for example, compounds based on alkyl phenols, such as, for example, nonylphenol polyglycol ether, or on alkyl- or alkylaryl sulfonates. Such surfactants may also be used because of the property of protecting the wafer surface against attack by the alkaline component.

A particularly rapid hydrophilization can be achieved if the wafers are brought into contact for a short time with a solution containing hydrofluoric acid before the actual treatment, for example before immersion. In this connection, hydrofluoric acid concentrations from about 0.3% by weight upwards are adequate, even if higher values right up to concentrated solutions may also be used. The duration of the treatment is expediently 10 to 100 seconds and the temperature set in this connection is advantageously 15 to 45° C.

The treatment of the surfaces of silicon wafers to hydrophilize and/or remove cement residues originating from the polishing operation using solutions adjusted to a pH of 8 to 14 with the aid of alkali-metal or alkaline-earth-metal compounds and containing at least 0.1% by weight of hydrogen peroxide has clear advantages over the known processes. For example, the chemical consumption is extremely low since the required substances can be used in very low concentrations and only the hydrogen peroxide is slowly used up in the course of the treatment. Furthermore, the process makes short treatment times possible even at room temperature so that heating and thermostating systems and preheating the required solutions can be eliminated. As a result, thermal stresses on the wafers during contact with the solution are also avoided.

Finally, since the solutions do not release any harmful exhaust gases, the disadvantages resulting therefrom and explained above can also be avoided. Furthermore, the silicon wafers which have been hydrophilized and/or from which cement residues have been removed by the process according to the invention show excellent properties in downstream cleaning steps within the framework of the standard cleaning processes. For example, they can be converted to a completely particle-free state with the aid of the usual method for removing adhering particles by means of coated rollers. Moreover, it has also been found that the so treated silicon wafers prove to be at least equivalent to the wafers hydrophilized in the conventional manner in the downstream oxidation processes.

A particular advantage is that, within the framework of the cleaning process, subsequent to the polishing operation, for removing cement and hydrophilizing the wafers, solutions of the same or similar composition may be used. The risk of entrainment of interfering foreign ions can consequently be kept low. A possible process sequence may, for example, provide a first treatment in a cement-removing bath and a second treatment in a hydrophilizing bath. Both baths are provided with hydrogen peroxide solutions of the same or different concentration and rendered alkaline, for example by means of potassium carbonate. If necessary, a treatment with hydrofluoric acid may be inserted between these two steps, which treatment may be preceded or followed by an additional rinsing step involving water.

In principle, however, there is no mandatory requirement for carrying out both substeps, that is to say, the hydrophilization step and the cement-removal step as specified in the process according to the invention, in a process sequence which is divided up into two individual steps. It is also possible to use another method for one of the two substeps, that is to say, for example, cement removal by means of trichloroethylene and hydrophilization by means of ammonia/hydrogen peroxide. Such a cement removal will be carried out primarily where cements are used which are not attacked, or not attacked to an extent sufficient for stripping, by alkaline solutions. On the other hand, the cement removal method according to the invention is particularly suitable for removing residues or cements which are soluble in the alkaline range, such as, for example, those based on maleic or phthalic resins or branched polyester systems containing hydroxyl groups or even shellac. It is also equally possible, however, in accordance with a further embodiment of the invention for both substeps to be combined and carried out in a single operation, for example, in only one spray bath. The invention will now be described in further detail with reference being made to the following examples. It should, however, be recognized that the examples are given as being illustrative of the present invention and are not intended to define the spirit and scope thereof.

EXAMPLE 1

Solutions of different compounds of the alkali metals sodium and potassium having an alkaline reaction, the pH of which (measured by means of a pH electrode) was in the region of 9–14, were provided at various temperatures and concentrations. The solutions were placed in a temperature-controlled immersion bath (bath capacity approximately 100 liters) normally used for the hydrophilization of silicon wafers. The solutions contained proportions of hydrogen peroxide which varied in level, and also, in some additional cases proportions of a surfactant. In each case two process trays each containing 25 wafers to be hydrophilized were immersed in these solutions and left in the bath for different residence times. The surfaces of the wafers had hydrophobic properties, i.e., a water drop deposited on the wafer will run off without wetting the wafer. The conditions maintained in the individual experimental series are shown in the table.

Subsequent to this treatment, the wafers removed were in each case cleaned with fully demineralized water purified by reverse osmosis. All the silicon wafers obtained had hydrophilic properties, which could be seen from the fact that the surfaces were completely wetted with water. Of the wafers treated with the potassium-containing solutions, five were examined by random sampling for any contamination of the wafer surface with potassium using X-ray fluorescense analysis. The occupation of the surface by potassium was below the limit of detection of about $1 \times 10^{11}$ atoms/cm$^2$ for all the wafers.

Of the wafers treated with potassium carbonate, 20 pieces were packaged in the usual manner and then stored for 6 months. The wafers were then withdrawn and examined for the hydrophilic properties of the surface by immersion in water. All the wafers proved to be completely hydrophilic.

EXAMPLE 2

Silicon wafers which had been subjected to a one-sided polishing and still carried traces of the cement on their rear side (based on maleic resin) which was used for cementing to the polishing disk and which were clearly visible as fluorescing particles under the fluorescence microscope, were treated analogously to the procedure described in Example 1. The process parameters listed in the table were again maintained.

After the treatment and cleaning with fully demineralized water purified by reverse osmosis, the rear sides of the wafers were again examined under the fluorescense microscope. Cement residues could no longer be detected. In addition, the surfaces of all the wafers obtained proved to be hydrophilic.

EXAMPLE 3

Twenty-five (25) polished silicon wafers which had previously been immersed for about 30 seconds in an approximately 0.5% by weight hydrofluoric acid solution were provided for hydrophilization in a process tray. Twenty-five (25) otherwise identically pretreated silicon wafers, on which, however, no hydrofluoric acid treatment had been carried out, were provided in a control tray. Both groups of wafers had hydrophobic wafer surfaces.

Both trays were now immersed for approximately 15 seconds in a hydrophilizing bath in which an approximately one percent (1%) by weight potassium carbonate solution (pH approximately 10.5) with an $H_2O_2$ content of approximately 1% by weight was kept at a temperature of about 25° C. After removing the wafers, only the ones pretreated with hydrofluoric acid proved to be completely hydrophilized. The wafer group which had not been pretreated with hydrofluoric acid was no again immersed in the hydrophilizing bath for a further 20 seconds. These wafers were then also completely hydrophilized.

EXAMPLE 4

In a test to investigate the dielectric strength of thin oxide coatings produced on the wafers, two groups of wafers each containing 5 silicon wafers were provided with a 250 Å thick oxide coating by oxidizing for one hour in an oxygen-containing inert-gas atmosphere at approximately 900° C. Both groups of wafers had previously been subjected to a cleaning sequence subsequent to the polishing process in a similar but slightly different manner; the difference being that, in one group of wafers, the cement removal and hydrophilization was carried out with the aid of an approximately 5% by weight ammonia solution kept at 55° C. and containing approximately 1% by weight of hydrogen peroxide, whereas, with the other group, an approximately 1% by weight potassium carbonate solution kept at 25° C. and containing approximately 1% by weight of hydrogen peroxide was used for that purpose.

Subsequent to the oxidation, a polycrystalline silicon coating was deposited on the wafers with the aid of masks applied to them in a manner such that 50 square regions each having an area of 100 mm$^2$ and composed of polycrystalline silicon were in each case present on the oxide coating. Through each of these regions a current with an intensity of 6 mA was now passed for a period of 500 msec and then the number of those regions in which this treatment had not resulted in a breakdown was determined. In the case of wafers treated with solution containing ammonia, this proportion was between approximately 70 and 90%, while in the case of wafers treated with solutions containing potassium carbonate it was approximately 85 to 98%.

While only several embodiments and examples of the present invention have been described, it is obvious that many changes and modifications may be made thereunto, without departing from the spirit and scope of the invention.

TABLE

| Reagents used and process parameters in the hydrophilization or removal of cement residues | | | | | | | | | |
|---|---|---|---|---|---|---|---|---|---|
| | $K_2CO_3$ | | | $Na_2CO_3$ | | | Sodium acetate | | |
| Concentration (wt. %) | 0.5 | 5 | 10 | 0.5 | 5 | 10 | 0.5 | 5 | 10 |
| pH | 10.5 | 11.5 | 11.5–12 | 10.5 | 11.5 | 11.5–12 | 9 | 9–9.5 | 9–9.5 |
| Temperature (°C.) | 20 | 40 | 80 | 20 | 40 | 80 | 20 | 40 | 80 |
| Residence time (sec) | 300 | 10 | 2 | 300 | 10 | 2 | 300 | 10 | 2 |
| Proportion of $H_2O_2$ (wt. %) | 0.5 | 1 | 10 | 0.5 | 1 | 10 | 0.5 | 1 | 10 |
| Nonyl phenol | — | 0.5 | — | — | 0.5 | — | — | 0.5 | — |

TABLE-continued

Reagents used and process parameters in the hydrophilization or removal of cement residues polyglycol ether (wt. %)

| | | KOH | | | $K_2CO_3$/ KOH | | | Sodium borate/ sodium hydroxide solution |
|---|---|---|---|---|---|---|---|---|
| Concentration (wt. %) | | 0.5 | 5 | 10 | 0.5/0.5 | | | 5/4 |
| pH | | 12 | 13.5 | 14 | 14 | | | 10.8 |
| Temperature (°C.) | | 20 | 40 | 80 | 20 | 40 | 80 | 40 |
| Residence time (sec) | | 300 | 10 | 2 | 300 | 10 | 2 | 10 |
| Proportion of $H_2O_2$ (wt. %) | | 0.5 | 1 | 10 | 0.5 | 1 | 10 | 1 |
| Nonyl phenol polyglycol ether (wt. %) | | — | 0.5 | — | | 0.5 | | — |

What is claimed is:

1. A process for the surface treatment of silicon wafers by utilizing alkaline aqueous solutions containing hydrogen peroxide, wherein the treatment effects a result which is selected from the group consisting of hydrophilizing by means of surface oxidation, cement-residue-removal, and a combination thereof, which process comprises the step of:

contacting said wafer with at least one aqueous solution having a minimum content of 0.1% by weight of hydrogen peroxide and adjusted to a pH of 8-14 with the aid of at least one salt of the alkali metals or alkaline-earth metals formed with weak acids, to produce said treatment on the wafer surface.

2. The process as claimed in claim 1, wherein the pH of the aqueous solution is adjusted to 9-12.

3. The process as claimed in claim 1, wherein alkali-metal salts of carbon-containing acids are used to adjust the pH.

4. The process as claimed in claim 3, wherein a member selected from the group consisting of potassium salts of carbonic acid, sodium salts of carbonic acid, potassium salts of acetic acid, sodium salts of acetic acid, potassium salts of citric acid, sodium salts of citric acid, and a combination thereof is used to adjust the pH.

5. The process as claimed in claim 1, wherein the solution is held at a temperature of 15 to 40° C.

6. The process as claimed in claim 1, wherein the concentration of the compounds of the alkali or alkaline-earth metals in the solution is adjusted to 0.1 to 10% by weight.

7. The process as claimed in claim 1, wherein the silicon wafers are contacted with a solution containing hydrofluoric acid before contacting the wafer surface with said at least one aqueous solution.

8. The process as claimed in claim 1, wherein the hydrophilizing is carried out in a first step by contacting the wafer surface with aqueous solution and the cement-residue removing is carried out in a second step by contacting the wafer surface with said alkaline aqueous solution.

9. A process for the surface treatment of silicon wafers by utilizing alkaline aqueous solutions containing hydrogen peroxide, wherein the treatment effects a result which is selected from the group consisting of hydrophilizing by means of surface oxidation, cement-residue-removal, and a combination thereof, which process consists essentially of the steps of:

contacting said wafer with at least one aqueous solution consisting essentially of a minimum content of 0.1% by weight of hydrogen peroxide and adjusted to a pH of 8-14 with the aid of at least one salt of the alkaline metals or alkaline-earth metals formed with weak acids, to produce said treatment on the wafer surface; and holding the solution at a temperature of 15 to 40° C.

* * * * *